United States Patent
Chen et al.

(10) Patent No.: US 10,267,859 B2
(45) Date of Patent: Apr. 23, 2019

(54) METHOD AND APPARATUS FOR IDENTIFYING OPEN PHASE OF CIRCUIT BREAKER ON BASIS OF VOLTAGE

(71) Applicants: NR ELECTRIC CO., LTD, Jiangsu (CN); NR ENGINEERING CO., LTD, Jiangsu (CN)

(72) Inventors: Jun Chen, Jiangsu (CN); Kai Wang, Jiangsu (CN); Shouping Zhong, Jiangsu (CN); Guang Wang, Jiangsu (CN); Qixue Zhang, Jiangsu (CN); Jiasheng Chen, Jiangsu (CN); Zigang Guo, Jiangsu (CN); Huazhong Li, Jiangsu (CN); Yaoyao Ji, Jiangsu (CN)

(73) Assignees: NR ELECTRIC CO., LTD, Jiangsu (CN); NR ENGINEERING CO., LTD, Jiangsu (CN)

( * ) Notice: Subject to any disclaimer, the term of this patent is extended or adjusted under 35 U.S.C. 154(b) by 0 days.

(21) Appl. No.: 15/570,358

(22) PCT Filed: Feb. 19, 2016

(86) PCT No.: PCT/CN2016/074077
§ 371 (c)(1),
(2) Date: Oct. 29, 2017

(87) PCT Pub. No.: WO2016/173312
PCT Pub. Date: Nov. 3, 2016

(65) Prior Publication Data
US 2018/0149699 A1 May 31, 2018

(30) Foreign Application Priority Data
Apr. 29, 2015 (CN) .......................... 2015 1 0213191

(51) Int. Cl.
*G01R 31/327* (2006.01)
*G01R 19/10* (2006.01)
(Continued)

(52) U.S. Cl.
CPC ......... *G01R 31/3275* (2013.01); *G01R 19/10* (2013.01); *G01R 19/2509* (2013.01);
(Continued)

(58) Field of Classification Search
CPC .... G01R 31/3275; G01R 19/10; H02H 3/027; H02H 3/265
See application file for complete search history.

(56) References Cited

U.S. PATENT DOCUMENTS

2003/0039086 A1 * 2/2003 Kase ................ H02H 3/081
361/65
2010/0179780 A1 * 7/2010 Taft .................... G01R 19/2513
702/64
(Continued)

FOREIGN PATENT DOCUMENTS

| CN | 104092201 | 10/2014 |
| CN | 104215897 | 12/2014 |

(Continued)

*Primary Examiner* — Scott Bauer
(74) *Attorney, Agent, or Firm* — JCIPRNET

(57) ABSTRACT

A method and apparatus for identifying an open phase of a circuit breaker on the basis of voltage. The method comprises: a protection apparatus measures three-phase voltages at two sides of a circuit breaker; respectively calculates a vector difference and an effective value of the voltages at two sides of the circuit breaker; when the phase voltages at two sides are both greater than 80% to 90% of a rated voltage, and the voltage vector difference at two sides of the one-phase or two-phase circuit breaker is greater than a set (Continued)

voltage, it is determined that the circuit breaker has an open phase; and actuates an alarming or tripping operation after a short time delay t.

15 Claims, 1 Drawing Sheet

(51) Int. Cl.
*H02H 3/02* (2006.01)
*H02H 7/22* (2006.01)
*G01R 19/25* (2006.01)
*H02H 1/00* (2006.01)
*H02H 3/027* (2006.01)
*H02H 3/26* (2006.01)
*H02H 3/04* (2006.01)

(52) U.S. Cl.
CPC .......... *H02H 1/0092* (2013.01); *H02H 3/027* (2013.01); *H02H 3/265* (2013.01); *H02H 7/22* (2013.01); *H02H 3/04* (2013.01)

(56) References Cited

U.S. PATENT DOCUMENTS

2013/0128402 A1* 5/2013 Otomo ................... H02H 3/066
 361/59
2013/0279048 A1* 10/2013 Juha ....................... H02H 7/045
 361/36

FOREIGN PATENT DOCUMENTS

CN 104795801 7/2015
JP 2001054241 2/2001

* cited by examiner

METHOD AND APPARATUS FOR IDENTIFYING OPEN PHASE OF CIRCUIT BREAKER ON BASIS OF VOLTAGE

CROSS-REFERENCE TO RELATED APPLICATION

This application is a 371 of international application of PCT application serial no. PCT/CN2016/074077, filed on Feb. 19, 2016, which claims the priority benefit of China application no. 201510213191.4, filed on Apr. 29, 2015. The entirety of each of the abovementioned patent applications is hereby incorporated by reference herein and made a part of this specification.

TECHNICAL FIELD

The invention pertains to the field of power system relay protection, in particular relates to a method for identifying an open phase of a circuit breaker on the basis of voltage and the corresponding relay protection apparatus or monitoring apparatus.

BACKGROUND

At present, the widely applied open-phase protection for circuit breakers on site is generally composed of three-phase inconsistent contact, phase current, zero-sequence current and negative-sequence current criteria. Under the working condition of operation under light load, owing to the small phase current, the negative-sequence current is quite small when the circuit breaker is in an open phase, it is difficult for the negative-sequence current to exceed its preset value, and the open-phase protection for the circuit breaker can't activate. The circuit breaker at the generator side is generally three-phase linked, not provided with three-phase inconsistent contact and unable to employ the traditional open-phase protection. The open-phase accidents caused by the breakage of tie bar in one phase of the circuit breaker at the generator side have occurred many times on site. Owing to the lack of open-phase protection, the power unit has to endure the negative-sequence current for a long time which threatens the safety of the generator. Thus, an open-phase protection independent from three-phase inconsistent contact is needed. In consideration of the above shortcomings existing in the traditional open-phase protection for circuit breakers, it is necessary to undertake research into a method and apparatus for identifying the open phase of circuit breaker independent from current magnitude and three-phase inconsistent contact.

SUMMARY OF THE INVENTION

The main goal of the invention is to provide a method for identifying an open phase of a circuit breaker on the basis of voltage, independent from current magnitude, to solve the problem of failure in identifying by current criteria previously when the circuit breaker has an open phase under light load, and moreover, since three-phase inconsistent contact is not needed for circuit breaker, it also solves the problem of identifying the open phase of three-phase linked circuit breakers.

The invention utilizes the technical solution that: the theoretical analysis indicates that when a circuit breaker has an open phase, a certain vector difference will be produced between the voltages at two sides of the port, and therefore an open phase can be determined by identifying the vector difference between the voltages at two sides of the circuit breaker. A protection apparatus measures three-phase voltages at two sides of the circuit breaker; and respectively calculates the vector difference and the effective value of the voltages at two sides of the circuit breaker, when the phase voltages at two sides are both greater than 80% to 90% of the rated voltage, and the voltage vector difference at two sides of a certain one-phase or two-phase circuit breaker is greater than the set voltage, it is determined that the circuit breaker has an open phase, and it actuates an alarming or tripping operation after a short time delay t.

The invention also provides an open-phase protection apparatus for circuit breaker on the basis of voltage, comprising a sampling module, a Fourier calculation module, a compensating module and an identifying and actuating module, wherein:

the sampling module is used for the open-phase protection apparatus to sample the voltages at two sides of the circuit breaker;

the Fourier calculation module is used for calculating the real part and the imaginary part of the fundamental wave vectors of the phase voltages at two sides and the fundamental wave amplitudes according to the results of the sampling module;

the compensating module is used for compensating the transmission error between TVs at two sides according to the results of the Fourier calculation module, so that the voltage vector difference of TVs at two sides of the port is 0 in case of normal operation;

the identifying and actuating module is used for identifying when the vector difference of voltages at two sides of the circuit breaker exceeds the upper limit of the preset range according to the results of the calculation module and the compensating module, and giving an alarming signal or tripping signal and outputting the contact state of tripping relay after a time delay.

Further, in the Fourier calculation module, the Fourier algorithm is employed for all the fundamental wave amplitudes of three-phase voltages at two sides of the circuit breaker.

The computation formulas for the fundamental wave amplitudes of the TV phase voltages at two sides are as follows:

$$\begin{cases} U_{\phi.Re} = \dfrac{2}{N}\sum_{k=0}^{N-1} u_\phi(k)\cos\left(\dfrac{2\pi k}{N}\right) \\ U_{\phi.Im} = -\dfrac{2}{N}\sum_{k=0}^{N-1} u_\phi(k)\sin\left(\dfrac{2\pi k}{N}\right) \phi = a,b,c \\ U_{\phi.AM} = \sqrt{U_{\phi.Re}^2 + U_{\phi.Im}^2} \end{cases} \quad \text{[Formula 4]}$$

Wherein, N is the times of sampling of the protection apparatus in each power frequency cycle, $U_{\varphi Re}$ and $U_{\varphi Im}$ are the real part and the imaginary part of the fundamental wave of phase voltage, respectively, and $U_{\varphi.AM}$ is the fundamental wave amplitude of phase voltage.

Further, in the compensating module, two compensation coefficients are introduced for compensating the transmission error between TVs at two sides of the circuit breaker.

Vector difference of voltages at two sides of the circuit breaker:

$$\Delta \dot{U}_\varphi = \dot{U}_{\varphi M} - (k_{\varphi 1} + jk_{\varphi 2})\cdot \dot{U}_{\varphi N}, \varphi = a,b,c \quad \text{[Formula 5]}$$

wherein, $\dot{U}_{\varphi M}$ and $\dot{U}_{\varphi N}$ are the phase voltage vectors at M and N sides, $\dot{U}_{\varphi M}=U_{\varphi M.Re}-jU_{\varphi M.Im}$, $\dot{U}_{\varphi N}=U_{\varphi N.Re}-jU_{\varphi N.Im}$, $k_{\varphi 1}$ and $k_{\varphi 2}$ are the compensating coefficients used for compensating the transmission error between TVs at two sides, so that the voltage vector difference of TVs at two sides of the port is 0 in case of normal operation;

the full cycle Fourier algorithm of cosine models is employed, and the adjustment coefficient is calculated on the basis of the voltage waveform under normal conditions on condition that the phasor difference of two sides is 0:

$$\begin{cases} U_{\varphi M.Re} - k_{\varphi 1}U_{\varphi N.Re} - k_{\varphi 2}U_{\varphi N.Im} = 0 \\ U_{\varphi M.Im} + k_{\varphi 2}U_{\varphi N.Re} - k_{\varphi 1}U_{\varphi N.Im} = 0 \end{cases} \quad [\text{Formula 6}]$$

$$k_{\varphi 1} = \frac{U_{\varphi M.Re} \cdot U_{\varphi N.Re} + U_{\varphi M.Im} \cdot U_{\varphi N.Im}}{U_{\varphi N.Re}^2 + U_{\varphi N.Im}^2} \quad [\text{Formula 7}]$$

$$k_{\varphi 2} = \frac{U_{\varphi M.Re} - k_{\varphi 1}U_{\varphi N.Re}}{U_{\varphi N.Im}} \quad [\text{Formula 8}]$$

When the circuit breaker has an open phase, the voltage difference of TVs at two sides of the port of the fault phase will have a certain value, and the above features form the criteria for open phase of a switch.

Further, in the identifying and actuating module, if any one of criteria in Formula 1 to Formula 3 is satisfied, an open phase can be identified, and the protection apparatus actuates an alarming or tripping operation after a short time delay t.

Criterion for an open phase in Phase A of the circuit breaker:

$$\begin{cases} \min(U_{a.AM}, U_{A.AM}) > \eta \% \ U_{\varphi N} \\ |\Delta \dot{U}_A| \geq \Delta U_{set} \end{cases} \quad [\text{Formula 1}]$$

Wherein, $U_{a.AM}$ and $U_{A.AM}$ are the voltage amplitudes in Phase A at M side and N side, respectively, $U_{\varphi N}$ is the rated phase voltage, $|\Delta \dot{U}_A|$ is the amplitude of voltage vector difference in Phase A at two sides, $\Delta U_{set}$ is the set value of voltage difference at two sides, $\eta$ is generally valued as 80 to 90, and min represents taking the minimum value of the two values.

Criterion for an open phase in Phase B of the circuit breaker:

$$\begin{cases} \min(U_{b.AM}, U_{B.AM}) > \eta U_{\varphi N} \\ |\Delta \dot{U}_B| \geq \Delta U_{set} \end{cases} \quad [\text{Formula 2}]$$

Criterion for an open phase in Phase C of the circuit breaker:

$$\begin{cases} \min(U_{c.AM}, U_{C.AM}) > \eta U_{\varphi N} \\ |\Delta \dot{U}_C| \geq \Delta U_{set} \end{cases} \quad [\text{Formula 3}]$$

Further: The set value of vector difference $\Delta U_{set}$ can be valued within the range of 0.1 to 10.0V.

Further: The protection apparatus actuates an alarming or tripping operation after a short time delay t, and the set value of time delay can be valued within the range of 0.1 to 10 s.

The invention has the advantages that it is unnecessary to identify the current magnitude, and it solves the problem of failure in identifying an open phase by the traditional negative-sequence current criteria when the circuit breaker has an open phase under light load; since it is unnecessary to identify the three-phase inconsistent contact, it is also suitable for three-phase linked circuit breakers, whereas the previous principle of open-phase protection can't identify the open phase of three-phase linked circuit breakers.

DETAILED DESCRIPTION OF THE INVENTION

The technical solution of the invention will be described below in details in conjunction with the drawings.

Figure 1:
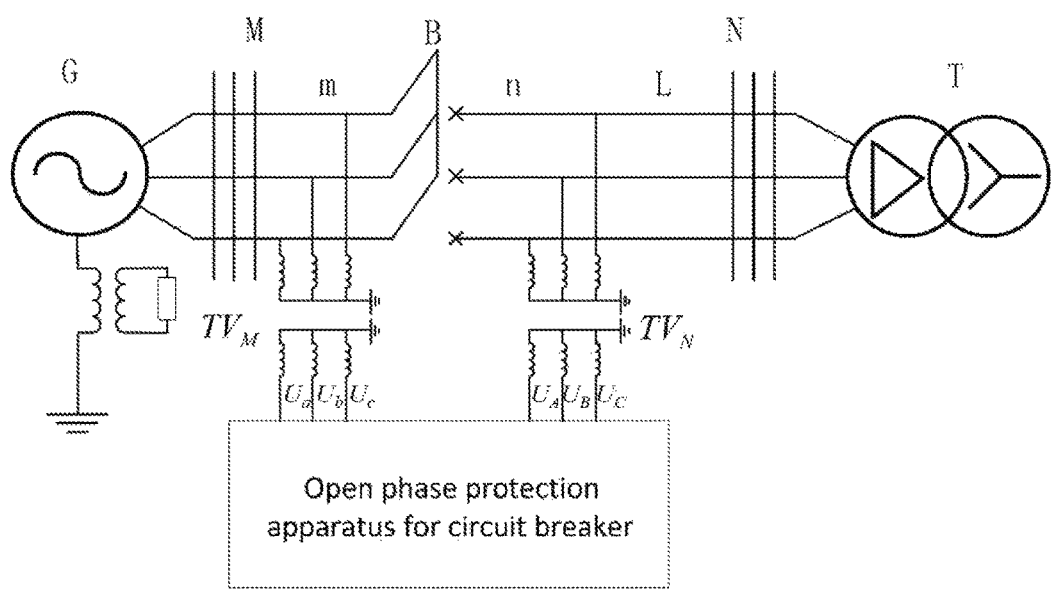
FIG. 1 shows the diagram of measuring the three-phase voltages at two sides of the port when the circuit breaker has an open phase according to the invention, in which, G is a generator, T is a transformer connected to the generator, L is the line, B is a three-phase circuit breaker, m and n are the ports of the circuit breaker, $TV_M$ is the voltage mutual inductor at M side of the circuit breaker, $TV_N$ is the voltage mutual inductor at N side of the circuit breaker, $U_a$, $U_b$ and $U_c$ are the three-phase voltages at M side, and $U_A$, $U_B$ and $U_C$ are the three-phase voltages at N side.

In FIG. 1, three-phase voltages at two sides are measured at the TVs at two sides of the port of the circuit breaker, and the fundamental wave amplitudes of voltages at two sides are calculated using the full cycle Fourier algorithm.

The computation formulas for the fundamental wave amplitudes of the TV phase voltages at two sides are as follows:

$$\begin{cases} U_{\phi.Re} = \frac{2}{N}\sum_{k=0}^{N-1} u_\phi(k)\cos\left(\frac{2\pi k}{N}\right) \\ U_{\phi.Im} = -\frac{2}{N}\sum_{k=0}^{N-1} u_\phi(k)\sin\left(\frac{2\pi k}{N}\right) \phi = a, b, c \\ U_{\phi.AM} = \sqrt{U_{\phi.Re}^2 + U_{\phi.Im}^2} \end{cases} \quad [\text{Formula 1}]$$

Wherein, N is the times of sampling of the protection apparatus in each power frequency cycle, $U_{\Phi.Re}$ and $U_{\Phi.Im}$ are the real part and the imaginary part of the fundamental wave of phase voltage, respectively, and $U_{\Phi.AM}$ is the fundamental wave amplitude of phase voltage.

Vector difference of voltages at two sides of the port of the switch:

$$\Delta \dot{U}_\varphi = \dot{U}_{\varphi M} - *k_{\varphi 1}+jk_{\varphi 2})\cdot \dot{U}_{\varphi N}, \varphi=a,b,c \quad [\text{Formula 2}]$$

Wherein, $\dot{U}_{\varphi M}$ and $\dot{U}_{\varphi N}$ are the phase voltage vectors at M and N sides, $\dot{U}_{\varphi M}=U_{\varphi M.Re}-jU_{\varphi M.Im}$, $\dot{U}_{\varphi N}=U_{\varphi N.Re}-jU_{\varphi N.Im}$, $k_{\Phi 1}$ and $k_{\Phi 2}$ are the compensating coefficients used for compensating the transmission error between TVs at two sides, so that the voltage vector difference of TVs at two sides of the port is 0 in case of normal operation.

The full cycle Fourier algorithm of cosine models is employed, and the adjustment coefficient is calculated on the basis of the voltage waveform under normal conditions on condition that the phasor difference of two sides is 0:

$$\begin{cases} U_{\varphi M.Re} - k_{\varphi 1} U_{\varphi N.Re} - k_{\varphi 2} U_{\varphi N.Im} = 0 \\ U_{\varphi M.Im} + k_{\varphi 2} U_{\varphi N.Re} - k_{\varphi 1} U_{\varphi N.Im} = 0 \end{cases}$$ [Formula 3]

$$k_{\varphi 1} = \frac{U_{\varphi M.Re} \cdot U_{\varphi N.Re} + U_{\varphi M.Im} \cdot U_{\varphi N.Im}}{U_{\varphi N.Re}^2 + U_{\varphi N.Im}^2}$$ [Formula 4]

$$k_{\varphi 2} = \frac{U_{\varphi M.Re} - k_{\varphi 1} U_{\varphi N.Re}}{U_{\varphi N.Im}}$$ [Formula 5]

When the circuit breaker has an open phase, the voltage difference of TVs at two sides of the port of the fault phase will have a certain value, and the above features form the criteria for open phase of the switch.

Criterion for an open phase in Phase A of the circuit breaker:

$$\begin{cases} \min(U_{a.AM}, U_{A.AM}) > \eta \% \ U_{\phi N} \\ |\Delta \dot{U}_A| \geq \Delta U_{set} \end{cases}$$ [Formula 6]

Wherein, $U_{\varphi.AM}$ and $U_{A.AM}$ are the voltage amplitudes in Phase A at M side and N side, respectively, $U_{\varphi N}$ is the rated phase voltage, $|\Delta \dot{U}_A|$ is the amplitude of voltage vector difference in Phase A at two sides, $\Delta U_{set}$ is the set value of voltage difference, generally ranging between 0.1 to 10V, $\eta$ is generally valued as 80 to 90, and min represents taking the minimum value of the two values.

Criterion for an open phase in Phase B of the circuit breaker:

$$\begin{cases} \min(U_{b.AM}, U_{B.AM}) > \eta U_{\phi N} \\ |\Delta \dot{U}_B| \geq \Delta U_{set} \end{cases}$$ [Formula 7]

Criterion for an open phase in Phase C of the circuit breaker:

$$\begin{cases} \min(U_{c.AM}, U_{C.AM}) > \eta U_{\phi N} \\ |\Delta \dot{U}_C| \geq \Delta U_{set} \end{cases}$$ [Formula 8]

If any one condition of Formula 6 to Formula 8 is satisfied, the protection apparatus actuates an alarming or tripping operation after a short time delay t, and the set value of time delay is generally valued within the range of 0.1 to 10 s.

Figure 2:
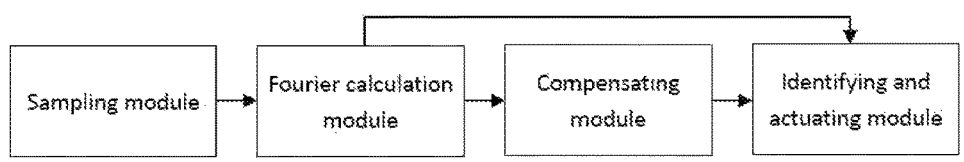
FIG. 2 is the structural diagram of the apparatus provided by the invention.

In addition, the invention also provides an open-phase protection apparatus for circuit breaker on the basis of voltage, as shown in FIG. 2, comprising a sampling module, a Fourier calculation module, a compensating module and an identifying and actuating module, wherein:

the sampling module is used for the open-phase protection apparatus to sample the voltages at two sides of the circuit breaker;

the Fourier calculation module is used for calculating the real part and the imaginary part of the fundamental wave vectors of the phase voltages at two sides and the fundamental wave amplitudes according to the results of the sampling module;

the compensating module is used for compensating the transmission error between TVs at two sides according to the results of the Fourier calculation module, so that the voltage vector difference of TVs at two sides of the port is 0 in case of normal operation;

the identifying and actuating module is used for identifying when the vector difference of voltages at two sides of the circuit breaker exceeds the upper limit of the preset range according to the results of the calculation module and the compensating module, and giving an alarming signal or tripping signal and outputting the contact state of tripping relay after a time delay.

The above embodiments are intended to explain the technical concept of the invention only, and by no means limit the scope of the invention, and any modification on the basis of the technical solution in accordance with the invention are all within the scope of the invention.

What is claimed is:

1. A method for identifying an open phase of a circuit breaker on a basis of voltage, comprising: a protection apparatus measures three-phase voltages at two sides of the circuit breaker; respectively calculates a voltage vector difference and an effective value of fundamental waves of three-phase voltages at the two sides of the circuit breaker; wherein when the three-phase voltages at the two sides of the circuit breaker are both greater than a set threshold value, and a voltage vector difference of one of the phase of the three-phase voltage at the two sides of the circuit breaker is greater than the set threshold value, it is determined that the circuit breaker has the open phase; and actuates an alarming or tripping operation after a time delay t.

2. The method for identifying the open phase of the circuit breaker on the basis of the voltage according to claim 1, wherein the set threshold value is 80% to 90% of a rated voltage.

3. The method for identifying the open phase of the circuit breaker on the basis of the voltage according to claim 1, wherein values of the three-phase voltages at the two sides of the circuit breaker are taken from three-phase voltage mutual inductors at the two sides of the circuit breaker.

4. The method for identifying the open phase of the circuit breaker on the basis of the voltage according to claim 1, wherein if any one of criteria in the following Formula 1 to Formula 3 is satisfied, the open phase can be identified, and the protection apparatus actuates the alarming or tripping operation after the time delay t;

a criterion for the open phase in Phase A of the circuit breaker:

$$\begin{cases} \min(U_{a.AM}, U_{A.AM}) > \eta \% \ U_{\phi N} \\ |\Delta \dot{U}_A| \geq \Delta U_{set} \end{cases};$$ [Formula 1]

a criterion for the open phase in Phase B of the circuit breaker:

$$\begin{cases} \min(U_{b.AM}, U_{B.AM}) > \eta U_{\phi N} \\ |\Delta \dot{U}_B| \geq \Delta U_{set} \end{cases};$$ [Formula 2]

a criterion for the open phase in Phase C of the circuit breaker:

$$\begin{cases} \min(U_{c.AM}, U_{C.AM}) > \eta U_{\phi N} \\ |\Delta \dot{U}_C| \geq \Delta U_{set} \end{cases};$$ [Formula 3]

wherein, $U_{a.AM}$ and $U_{A.AM}$ are voltage amplitudes in the Phase A at an M side and an N side, respectively, $U_{b.AM}$ and $U_{B.AM}$ are voltage amplitudes in the Phase B at the M side and the N side, respectively, $U_{c.AM}$ and $U_{C.AM}$ are voltage amplitudes in the Phase C at the M side and the N side, respectively, $|\Delta \dot{U}_A|$ is an amplitude of voltage vector difference in Phase A, $|\Delta \dot{U}_B|$ is an amplitude of voltage vector difference in Phase B, $|\Delta \dot{U}_C|$ is an amplitude of voltage vector difference in Phase C, $U_{\Phi N}$ is a rated three-phase voltage, $\Delta U_{set}$ is a set value of a voltage vector difference at the two sides of the circuit breaker, $\eta$ is a scale factor, and min represents taking a minimum value of the two values.

5. The method for identifying the open phase of the circuit breaker on the basis of the voltage according to claim 1, wherein fundamental wave amplitudes of the three-phase voltages at the two sides of the circuit breaker are all calculated using a full cycle Fourier algorithm, computation formulas for the fundamental wave amplitudes of the three-phase voltages at the two sides of the circuit breaker are as follows:

$$\begin{cases} U_{\phi.Re} = \dfrac{2}{N}\sum_{k=0}^{N-1} u_\phi(k)\cos\left(\dfrac{2\pi k}{N}\right) \\ U_{\phi.Im} = -\dfrac{2}{N}\sum_{k=0}^{N-1} u_\phi(k)\sin\left(\dfrac{2\pi k}{N}\right) \\ U_{\phi.AM} = \sqrt{U_{\phi.Re}^2 + U_{\phi.Im}^2} \end{cases}$$ [Formula 4]

$\phi = a, b, c;$ wherein, k is a serial number of sampling, N is times of sampling of the protection apparatus in each power frequency cycle, $\Phi$ is a phase of the three-phase voltages at the two sides of the circuit breaker, $U_{\Phi.Re}$ and $U_{\Phi.Im}$ are a real part and an imaginary part of the fundamental wave of the three-phase voltage, respectively, and $U_{\Phi.Am}$ is a fundamental wave amplitude of the three-phase voltage.

6. The method for identifying the open phase of the circuit breaker on the basis of the voltage according to claim 1, wherein two compensation coefficients are introduced for compensating a transmission error of the three-phase voltage mutual inductors at the two sides of the circuit breaker, The voltage vector difference at the two sides of the circuit breaker:

$$\Delta \dot{U}_\varphi = \dot{U}_{\varphi M} - (k_{\varphi 1} + jk_{\varphi 2}) \cdot \dot{U}_{\varphi N}, \varphi = a, b, c$$ [Formula 5];

wherein, $\dot{U}_{\varphi M}$ and $\dot{U}_{\varphi N}$ are three-phase voltage vectors at an M side and an N side, $\dot{U}_{\varphi M} = U_{\varphi M.Re} - jU_{\varphi M.Im}$, $\dot{U}_{\varphi N} = U_{\varphi N.Re} - jU_{\varphi N.Im}$, $k_{\Phi 1}$ and $k_{\Phi 2}$ are compensating coefficients used for compensating the transmission error of the three-phase voltage mutual inductors at the two sides of the circuit breaker, so that the voltage vector difference of the three-phase voltage mutual inductors at two sides of a port is 0 in case of normal operation, $U_{\Phi M.Re}$ and $U_{\Phi M.Im}$, are a real part and an imaginary part of the fundamental wave of the three-phase voltage at the M side, and $U_{\Phi N.Re}$ and $U_{\Phi N.Im}$ are a real part and an imaginary part of the fundamental wave of the three-phase voltage at the N side;

a full cycle Fourier algorithm of cosine models is employed, and an adjustment coefficient is calculated on a basis of the voltage waveform under normal conditions on condition that a phasor difference of the two sides of the circuit breaker is 0:

$$\begin{cases} U_{\varphi M.Re} - k_{\varphi 1}U_{\varphi N.Re} - k_{\varphi 2}U_{\varphi N.Im} = 0 \\ U_{\varphi M.Im} + k_{\varphi 2}U_{\varphi N.Re} - k_{\varphi 1}U_{\varphi N.Im} = 0 \end{cases};$$ [Formula 6]

$$k_{\varphi 1} = \dfrac{U_{\varphi M.Re} \cdot U_{\varphi N.Re} + U_{\varphi M.Im} \cdot U_{\varphi N.Im}}{U_{\varphi N.Re}^2 + U_{\varphi N.Im}^2};$$ [Formula 7]

$$k_{\varphi 2} = \dfrac{U_{\varphi M.Re} - k_{\varphi 1}U_{\varphi N.Re}}{U_{\varphi N.Im}};$$ [Formula 8]

when the circuit breaker has the open phase, the voltage difference of the three-phase voltage mutual inductors at the two sides of the port of a fault phase will be greater than the set threshold value, and above features form criteria for the open phase of the switch.

7. The method for identifying the open phase of the circuit breaker on the basis of the voltage according to claim 4, wherein the set value of a voltage vector difference at the two sides of the circuit breaker $\Delta U_{set}$ is valued within a range of 0.1 to 10.0V.

8. The method for identifying the open phase of the circuit breaker on the basis of the voltage according to claim 1, wherein the protection apparatus actuates the alarming or tripping operation after the time delay t, and a set value of the time delay is valued within a range of 0.1 to 10 s.

9. An open-phase protection apparatus for a circuit breaker on a basis of voltage, comprising a sampling module, a Fourier calculation module, a compensating module and an identifying and actuating module, wherein:

the sampling module is used for the open-phase protection apparatus to sample the values of the three-phase voltages at two sides of the circuit breaker;

the Fourier calculation module is used for calculating a real part and an imaginary part of the fundamental wave vectors of the three-phase voltages at the two sides of the circuit breaker and fundamental wave amplitudes of the three-phase voltages at the two sides of the circuit breaker according to the values of the three-phase voltages sampled by the sampling module;

the compensating module is used for compensating a transmission error of three-phase voltage mutual inductors at the two sides of the circuit breaker according to results of the Fourier calculation module, so that a voltage vector difference of the three-phase voltage mutual inductors at the two sides of a port is 0 in case of normal operation;

the identifying and actuating module is used for identifying when the voltage vector difference of the voltages at the two sides of the circuit breaker exceeds an upper limit of a preset range according to results of the Fourier calculation module and the compensating module, and giving an alarming or tripping signal and outputting a contact state of a tripping relay after a time delay t.

10. The open-phase protection apparatus for the circuit breaker on the basis of the voltage according to claim 9, wherein the values of the three-phase voltages at the two sides of the circuit breaker are taken from the three-phase voltage mutual inductors at the two sides of the circuit breaker.

11. The open-phase protection apparatus for the circuit breaker on the basis of the voltage according to claim 9, wherein:
if any one of criteria in the following Formula 1 to Formula 3 is satisfied, the open phase can be identified, and the open-phase protection apparatus actuates an alarming or tripping operation after the time delay t;
a criterion for the open phase in Phase A of the circuit breaker:

$$\begin{cases} \min(U_{a.AM}, U_{A.AM}) > \eta \ \% \ U_{\phi N} \\ |\Delta \dot{U}_A| \geq \Delta U_{set} \end{cases} ; \quad \text{[Formula 1]}$$

a criterion for the open phase in Phase B of the circuit breaker:

$$\begin{cases} \min(U_{b.AM}, U_{B.AM}) > \eta U_{\phi N} \\ |\Delta \dot{U}_B| \geq \Delta U_{set} \end{cases} ; \quad \text{[Formula 2]}$$

a criterion for the open phase in Phase C of the circuit breaker:

$$\begin{cases} \min(U_{c.AM}, U_{C.AM}) > \eta U_{\phi N} \\ |\Delta \dot{U}_C| \geq \Delta U_{set} \end{cases} ; \quad \text{[Formula 3]}$$

wherein, $U_{a.AM}$ and $U_{A.AM}$ are voltage amplitudes in the Phase A at an M side and an N side, respectively, $U_{b.AM}$ and $U_{B.AM}$ are voltage amplitudes in the Phase B at the M side and the N side, respectively, $U_{c.AM}$ and $U_{C.AM}$ are voltage amplitudes in the Phase C at the M side and the N side, respectively, $|\Delta \dot{U}_A|$ an amplitude of a voltage vector difference in the Phase A, $|\Delta \dot{U}_B|$ an amplitude of a voltage vector difference in the Phase B, $|\Delta \dot{U}_C|$ is an amplitude of a voltage vector difference in the Phase C, $U_{\phi N}$ is a rated three-phase voltage, $\Delta U_{set}$ is a set value of a voltage difference at the two sides of the circuit breaker, η is a scale factor, and min represents taking a minimum value of two values.

12. The open-phase protection apparatus for the circuit breaker on the basis of the voltage according to claim 9, wherein:
the fundamental wave amplitudes of the three-phase voltages at the two sides of the circuit breaker are all calculated using a full cycle Fourier algorithm,
computation formulas for the fundamental wave amplitudes of the three-phase voltages at the two sides of the circuit breaker are as follows:

$$\begin{cases} U_{\phi.Re} = \dfrac{2}{N}\sum_{k=0}^{N-1} u_\phi(k)\cos\left(\dfrac{2\pi k}{N}\right) \\ U_{\phi.Im} = -\dfrac{2}{N}\sum_{k=0}^{N-1} u_\phi(k)\sin\left(\dfrac{2\pi k}{N}\right) \\ U_{\phi.AM} = \sqrt{U_{\phi.Re}^2 + U_{\phi.Im}^2} \end{cases} \quad \text{[Formula 4]}$$

$\phi = a, b, c;$ wherein, k is a serial number of sampling, N is times of sampling of the open-phase protection apparatus in each power frequency cycle, Φ is a phase of the three-phase voltages at the two sides of the circuit breaker, $U_{\phi.Re}$ and $U_{\phi.Im}$ are a real part and an imaginary part of the fundamental wave of the three-phase voltage, respectively, and $U_{\phi.AM}$ is the fundamental wave amplitude of the three-phase voltage.

13. The open-phase protection apparatus for the circuit breaker on the basis of the voltage according to claim 9, wherein:
two compensation coefficients are introduced for compensating a transmission error of the three-phase voltage mutual inductors at the two sides of the circuit breaker,
the voltage vector difference at the two sides of the circuit breaker:

$$\Delta \dot{U}_\varphi = \dot{U}_{\varphi M} - (k_{\varphi 1} + jk_{\varphi 2}) \cdot \dot{U}_{\varphi N}, \varphi = a, b, c \quad \text{[Formula 5]}$$

wherein, $\dot{U}_{\varphi M}$ and $\dot{U}_{\varphi N}$ are three-phase voltage vectors at an M side and an N side, $\dot{U}_{\varphi M} = U_{\varphi M.Re} - jU_{\varphi M.Im}$, $\dot{U}_{\varphi N} = U_{\varphi N.Re} - jU_{\varphi N.Im}$, $k_{\varphi 1}$ and $k_{\varphi 2}$ are compensating coefficients used for compensating the transmission error of the three-phase voltage mutual inductors at the two sides of the circuit breaker, so that the voltage vector difference of the three-phase voltage mutual inductors at the two sides of the port is 0 in case of normal operation, $U_{\varphi M.Re}$ and $U_{\varphi M.Im}$ are a real part and an imaginary part of the fundamental wave of the three-phase voltage at the M side, and $U_{\varphi N.Re}$ and $U_{\varphi N.Im}$ are a real part and an imaginary part of the fundamental wave of the three-phase voltage at the N side;
the full cycle Fourier algorithm of cosine models is employed, and an adjustment coefficient is calculated on a basis of the voltage waveform under normal conditions on condition that an phasor difference of the two sides of the circuit breaker is 0:

$$\begin{cases} U_{\varphi M.Re} - k_{\varphi 1} U_{\varphi N.Re} - k_{\varphi 2} U_{\varphi N.Im} = 0 \\ U_{\varphi M.Im} + k_{\varphi 2} U_{\varphi N.Re} - k_{\varphi 1} U_{\varphi N.Im} = 0 \end{cases} ; \quad \text{[Formula 6]}$$

$$k_{\varphi 1} = \dfrac{U_{\varphi M.Re} \cdot U_{\varphi N.Re} + U_{\varphi M.Im} \cdot U_{\varphi N.Im}}{U_{\varphi N.Re}^2 + U_{\varphi N.Im}^2}; \quad \text{[Formula 7]}$$

$$k_{\varphi 2} = \dfrac{U_{\varphi M.Re} - k_{\varphi 1} U_{\varphi N.Re}}{U_{\varphi N.Im}}; \quad \text{[Formula 8]}$$

when the circuit breaker has the open phase, the voltage difference of the three-phase voltage mutual inductors at the two sides of the port of a fault phase will be greater than the set threshold value, and above features form criteria for the open phase of the switch.

14. The open-phase protection apparatus for the circuit breaker on the basis of the voltage according to claim 11, wherein a set value of the voltage vector difference at the two sides of the circuit breaker $\Delta U_{set}$ can be valued within a range of 0.1 to 10.0V.

15. The open-phase protection apparatus for the circuit breaker on the basis of the voltage according to claim 9, wherein: the open-phase protection apparatus actuates the alarming or tripping operation after the time delay t, and a set value of the time delay is valued within a range of 0.1 to 10 s.

* * * * *